United States Patent [19]

Chau et al.

[11] Patent Number: 5,173,623

[45] Date of Patent: Dec. 22, 1992

[54] HIGH PERFORMANCE BICMOS LOGIC CIRCUITS WITH FULL OUTPUT VOLTAGE SWING UP TO FOUR PREDETERMINED VOLTAGE VALUES

[75] Inventors: Kwok K. Chau; James D. Gallia; Ashwin H. Shah, all of Dallas, Tex.

[73] Assignee: Texas Instruments Incorporated, Dallas, Tex.

[21] Appl. No.: 842,801

[22] Filed: Feb. 27, 1992

Related U.S. Application Data

[63] Continuation of Ser. No. 728,001, Jun. 28, 1991, abandoned, which is a continuation of Ser. No. 352,588, May 15, 1989, abandoned.

[51] Int. Cl.$^5$ ............... H03K 19/02; H03K 17/60; H03K 3/01; H03K 19/094
[52] U.S. Cl. .................... 307/446; 307/570; 307/270; 307/451
[58] Field of Search ............ 307/446, 451, 570, 270, 307/443

[56] References Cited

U.S. PATENT DOCUMENTS

| | | | |
|---|---|---|---|
| 4,703,203 | 10/1987 | Gallup et al. | 307/446 |
| 4,890,018 | 12/1989 | Fukushi et al. | 307/446 |
| 4,999,523 | 3/1991 | Cham et al. | 307/570 |
| 5,030,860 | 7/1991 | Tran | 307/570 |
| 5,068,548 | 11/1991 | El Gamel | 307/570 |

Primary Examiner—Stanley D. Miller
Assistant Examiner—Trong Quang Phan
Attorney, Agent, or Firm—Stanton C. Braden; Richard L. Donaldson; William E. Hiller

[57] ABSTRACT

BiCMOS circuits are disclosed which achieve high speed operation under a wide range of loading conditions. The circuits are capable of providing a full output voltage swing and dissipate virtually no static power. The BiCMOS circuits are implemented using both CMOS and bipolar transistors. The circuits use their output signal to control the CMOS transistors that overcome bipolar output drops for full swing operation. The same fundamental CMOS and bipolar configurations can be applied to implement complex and simple logic functions such as NAND, NOR, AND, or OR operations.

2 Claims, 22 Drawing Sheets

| TRANSISTOR | IN1=IN2=0 | IN1=0, IN2=1 | IN1=1, IN2=0 | IN1 = IN2 = 1 |
|---|---|---|---|---|
| P1 | ON | ON | OFF | OFF |
| P2 | ON | OFF | ON | OFF |
| PB | OFF+ | OFF+ | OFF+ | ON- |
| N1 | OFF | OFF | ON | ON |
| N2 | OFF | ON | OFF | ON |
| N1B | OFF | OFF | ON | ON |
| N2B | OFF | ON | OFF | ON |
| NB | ON | ON | ON | OFF |
| Q1 | ON- | ON- | ON- | OFF |
| Q2 | OFF | OFF | OFF | ON- |

Fig. 2

INITIAL TRANSISTOR SIZING: P1=P2, N1=N2, N1B=N2B, Q1=Q2

| | DELAY | THROUGH CURRENT |
|---|---|---|
| ∧ P1, P2 | ∨ | |
| ∧ PB | ∧ | |
| ∧ N1, N2 | ∨ | ∨ |
| ∧ N1B, N2B | ∨ | ∨ |
| ∧ NB | ∧ | |

∧ = INCREASE
∨ = DECREASE

Fig. 6b

| TRANSISTOR | IN1=IN2=0 | IN1=0, IN2=1 | IN1=1, IN2=0 | IN1 = IN2 = 1 |
|---|---|---|---|---|
| P1  | ON   | ON    | OFF   | OFF  |
| P2  | ON   | OFF   | ON    | OFF  |
| PB  | OFF+ | OFF+  | OFF+  | ON-  |
| N1B | OFF  | OFF   | ON    | ON   |
| N2B | OFF  | ON    | OFF   | ON   |
| NB  | ON   | ON    | ON    | OFF  |
| Q1  | ON-  | ON-   | ON-   | OFF  |
| Q2  | OFF  | OFF   | OFF   | ON-  |

Fig. 8

INITIAL TRANSISTOR SIZING: P1=P2, N1B=N2B, Q1=Q2

| | DELAY | THROUGH CURRENT |
|---|---|---|
| ∧ P1, P2 | ∨ | |
| ∧ PB | ∧ | |
| ∧ N1B, N2B | ∨ | ∧ |
| ∧ NB | ∧ | |

∧ = INCREASE
∨ = DECREASE

Fig. 12b

| INVERTER OUTPUT TRANSISTOR | IN1 = IN2 = 0 HL | IN1=0, IN2=1 HL | IN1=1, IN2=0 HL | IN1 = IN2 = 1 LH |
|---|---|---|---|---|
| P1 | ON | ON | OFF | OFF |
| P2 | ON | OFF | ON | OFF |
| PB | OFF+ | OFF+ | OFF+ | ON− |
| N1 | OFF | OFF | ON | ON |
| N2 | OFF | ON | OFF | ON |
| N1B | OFF | OFF | ON | ON |
| N2B | OFF | ON | OFF | ON |
| NB | ON | ON | ON | OFF |
| Q1 | ON− | ON− | ON− | OFF |
| Q2 | OFF | OFF | OFF | ON− |

Fig. 14

INITIAL TRANSISTOR SIZING: P1=P2, N1=N2, N1B=N2B, Q1=Q2
W1P=W1N = MINIMUM SIZE

| | DELAY | THROUGH CURRENT |
|---|---|---|
| ∧ W1P, W1N | ∧ | |
| ∧ P1, P2 | ∨ | |
| ∧ PB | ∧ | ∨ |
| ∧ N1, N2 | ∨ | ∨ |
| ∧ N1B, N2B | ∧ | |
| ∧ NB | ∧ | |

∧ = INCREASE

∨ = DECREASE

Fig. 18b

HIGH PERFORMANCE BICMOS LOGIC CIRCUITS WITH FULL OUTPUT VOLTAGE SWING UP TO FOUR PREDETERMINED VOLTAGE VALUES

This application is a continuation of application Ser. No. 07/728,001, filed Jun. 28, 1991 now abandoned, which is a continuation of application Ser. No. 07/352,588, filed May 15, 1989 now abandoned.

BACKGROUND OF THE INVENTION

It is desirable to have logic circuits which provide high speed operation consuming very little power. A circuit exhibiting these properties would greatly enhance extremely fast microprocessors and computer systems. Until now, no circuits capable of optimized speed within constraints of low power consumption have existed which are suitable to meet the demands dictated by today's electronic environment.

OBJECTS OF THE INVENTION

It is an object of the invention to provide a new and improved logic circuit.

It is another object of the invention to provide a new and improved logic circuit capable of high speed operation and low power consumption.

These and other objects of the invention, together with the features and advantages thereof, will become apparent from the following detailed specification when read together with the accompanying drawings in which applicable reference numerals and symbols have been carried forward.

SUMMARY OF THE INVENTION

A logic circuit is disclosed which operates at a relatively fast speed under a wide range of loading conditions in comparison with prior art circuits performing the same logic operation. The logic circuit is capable of providing a virtually full output voltage swing. Furthermore, the logic circuit dissipates practically no static power.

More specifically, the invention provides a first transistor connected across the terminals of a first pull-up device, at the output of the logic circuit. The first pull up device is operable to bring the circuit output to a first predetermined voltage value. The first transistor is also connected to a second pull-up device which is operable together with the first transistor to bring the output of the circuit to a second predetermined voltage value in connection with the output reaching the first predetermined voltage value. The first transistor shuts off the first pull-up device once the output of the circuit reaches the second predetermined voltage value. The output of the circuit is also connected to a first pull-down device and a second transistor. A switch is provided in order to allow the output to turn on the first pull-down device such that the output is brought to a third predetermined voltage value and to allow the second transistor to bring the output to a fourth predetermined voltage value.

In a first preferred embodiment of the invention, the elements are further specified as follows. The first pull-up device and the first pull-down device comprise bipolar transistors. The second pull-up device comprises at least one field effect transistor. The first and second transistors comprise field effect transistors. The switch comprises at least one field effect transistor. Additionally, a second pull-down device is connected to the first transistor. The second pull-down device is operable to discharge, in combination with the first transistor, a terminal of the first pull-up device.

A second preferred embodiment of the invention is the same as the first preferred embodiment of the invention with the exception that the second pull-down device is not included due to the fact that the first transistor is large enough so as not to require the voltage pull-down effort of the second pull-down device.

A third preferred embodiment of the invention is the same as the first embodiment of the invention with the addition of an inverter connected between the gate of the first transistor and the circuit output. The gates of the first and second transistor are connected together and to one terminal of the inverter.

A fourth preferred embodiment of the invention is the same as the third preferred embodiment of the invention with the exception that gates of the first and second transistor are connected to separate voltage supply sources.

A fifth preferred embodiment of the invention is the same as the third preferred embodiment of the invention with the exception that the first transistor is connected between the collector and emitter terminals of the bipolar transistor of the first pull-up device.

A sixth preferred embodiment of the invention is the same as the fifth preferred embodiment of the invention with the exception that the gates of the first and second transistors are connected to separate power supply sources.

BRIEF DESCRIPTION OF THE DRAWINGS

FIG. 2 illustrates the on and off states of the transistors in FIG. 1 in response to logical high or low inputs corresponding to 1 or 0, respectively, at inputs IN1 and IN2.

FIG. 6b is a chart illustrating the effect of transistor sizing on circuit delay and through current.

FIG. 8 illustrates the on and off states of the transistors in FIG. 7 in response to logical high or low inputs corresponding to 1 or 0, respectively, at inputs IN1 and IN2.

FIG. 12b is a chart, pertaining to the second embodiment of the invention, which illustrates the effect of transistor sizing on delay and through current.

FIG. 14 illustrates the on and off states of the transistors in FIG. 13 in response to logical high or low inputs corresponding to 1 or 0, respectively, at inputs IN1 and IN2.

FIG. 18b illustrates a chart of transistor sizing and its effect upon circuit delay and through current.

DETAILED DESCRIPTION OF THE INVENTION

Figure 1:
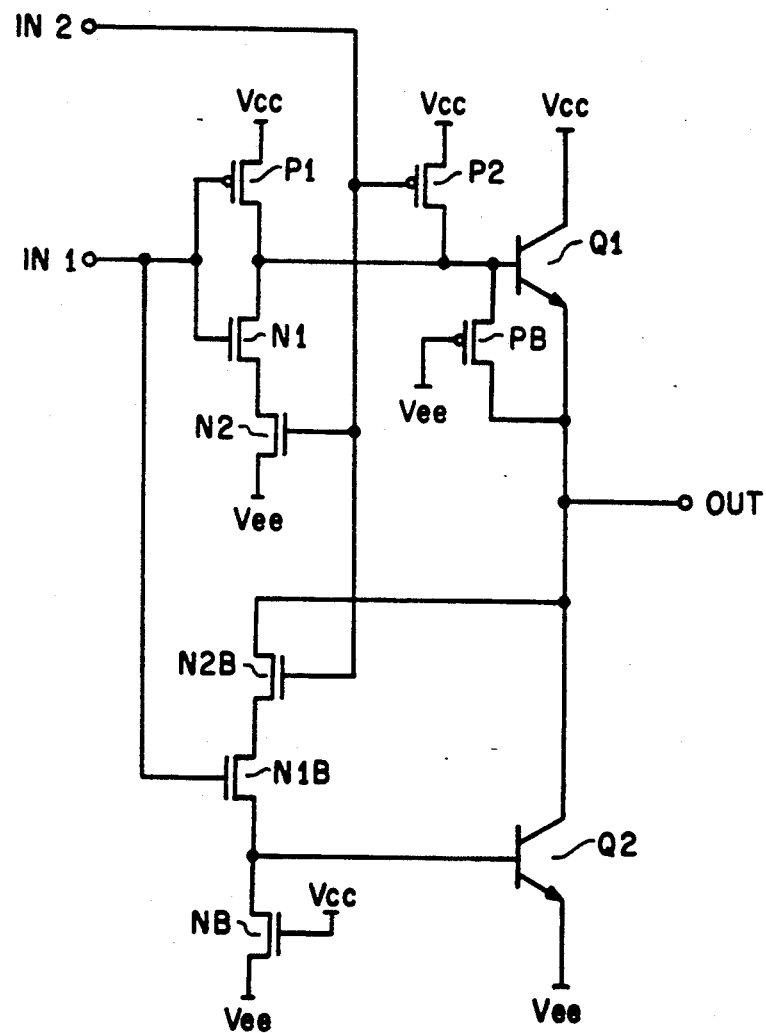
FIG. 1 illustrates a schematic drawing of a first preferred embodiment of the invention.

FIG. 1 illustrates a schematic drawing of a first preferred embodiment of the invention. In a NAND gate logic circuit generally designated by numeral 2, a first pull-up device comprising NPN bipolar transistor Q1 is coupled to output OUT. A second pull-up device comprising p-channel transistors P1 and P2 are connected to the base of transistor Q1 by their drains. The sources of transistors P1 and P2 as well as the collector of transistor Q1 is connected to supply voltage Vcc. P-channel transistor PB is connected to and between the base and emitter of transistor Q1 with its gate connected to voltage Vee. Alternatively, a switch can be substituted for transistor PB with its operation controlled by output OUT. For example, this switch may comprise a MOS transistor, an n-channel transistor, a p-channel transistor, a plurality of n-channel and/or p-channel transistors, a bipolar transistor or a plurality of bipolar transistors or a combination of the above. Vee throughout the description of the invention represents circuit ground. However, other values for Vee are contemplated and are possible. N-channel transistor NB and a first pull-down device comprising NPN bipolar transistor Q2 are coupled to the output of circuit 2. A switch, comprising n-channel transistors N1B and N2B connected together, are connected to the output of circuit 2, transistors NB and Q2. N-channel transistors N1 and N2 are connected between the circuit inputs at IN1 and IN2 and are coupled to the transistors of the first and second pull-up devices.

FIG. 2 illustrates the on and off states of the transistors in FIG. 1 in response to logical high or low inputs corresponding to 1 or 0 respectively at inputs IN1 and IN2. A plus sign being directly after "OFF" in FIG. 2 indicates that a transistor is off initially and will eventually turn on at steady state. A minus sign being directly after "ON" indicates that a transistor is initially on and will eventually turn off at steady state.

In operation, with low inputs at IN1 and IN2 (IN1=IN2=0), Both transistors P1 and P2 are on and provide base current to transistor Q1 in order to pull the circuit output OUT up to a voltage of VCC−VBE (VBE represents the base-emitter junction of transistor Q1). Transistor PB will eventually pull output OUT to VCC and thus turn transistor Q1 off. Note, that in order to turn on transistor PB, that its gate to source voltage must be lower than an associated threshold voltage. This gate to source voltage is dependent upon the output voltage at output OUT. With input IN1 low and IN2 high (IN1=0, IN2=1), transistor P1 is on and provides base current to transistor Q1 in order to pull output OUT up to a voltage of VCC−VBE. As with the case before, transistor PB eventually will pull the output to VCC and turn Q1 off. An input having IN1 high and IN2 low (IN1=1, IN2=0), will produce a similar result as with the case having IN1 low and IN2 high (IN1=0, IN2=1) except that transistor P2 is on and transistor P1 is off. With both inputs high and assuming the initial output voltage is VCC, transistors N1B and N2B are on to provide base current from output OUT to transistor Q2. Transistor Q2 will pull the output down to Vee. At the same time, transistors N1, N2 and PB will discharge the base of transistor Q1 to turn transistor Q1 off. Transistors N1B, N2B and NB will pull output OUT all the way down to ground and turn transistor Q2 off.

Figure 3:
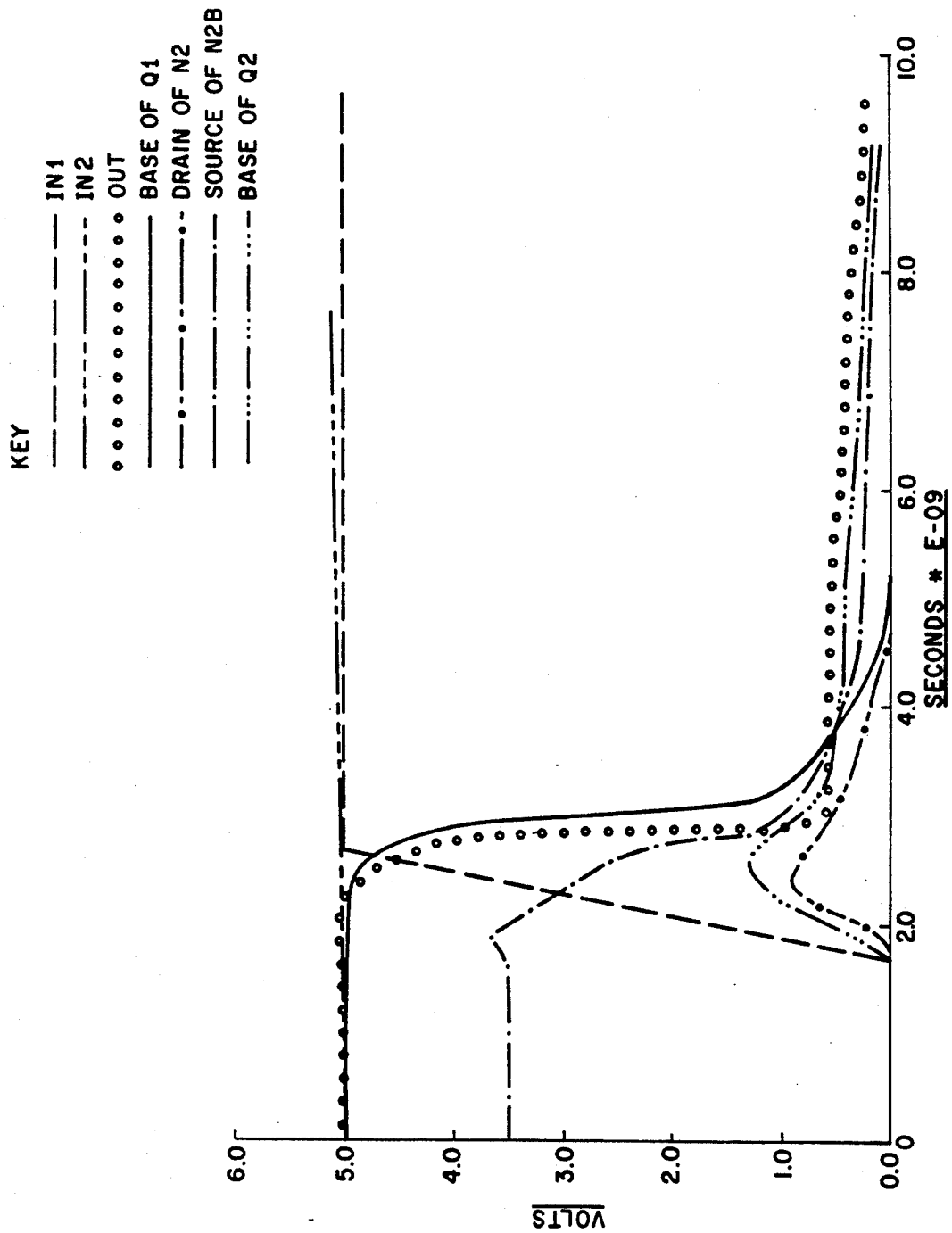
FIGS. 3 and 4 illustrate voltage vs. time plots for various inputs to a computer simulation of the circuit shown schematically in FIG. 1.
Figure 4:
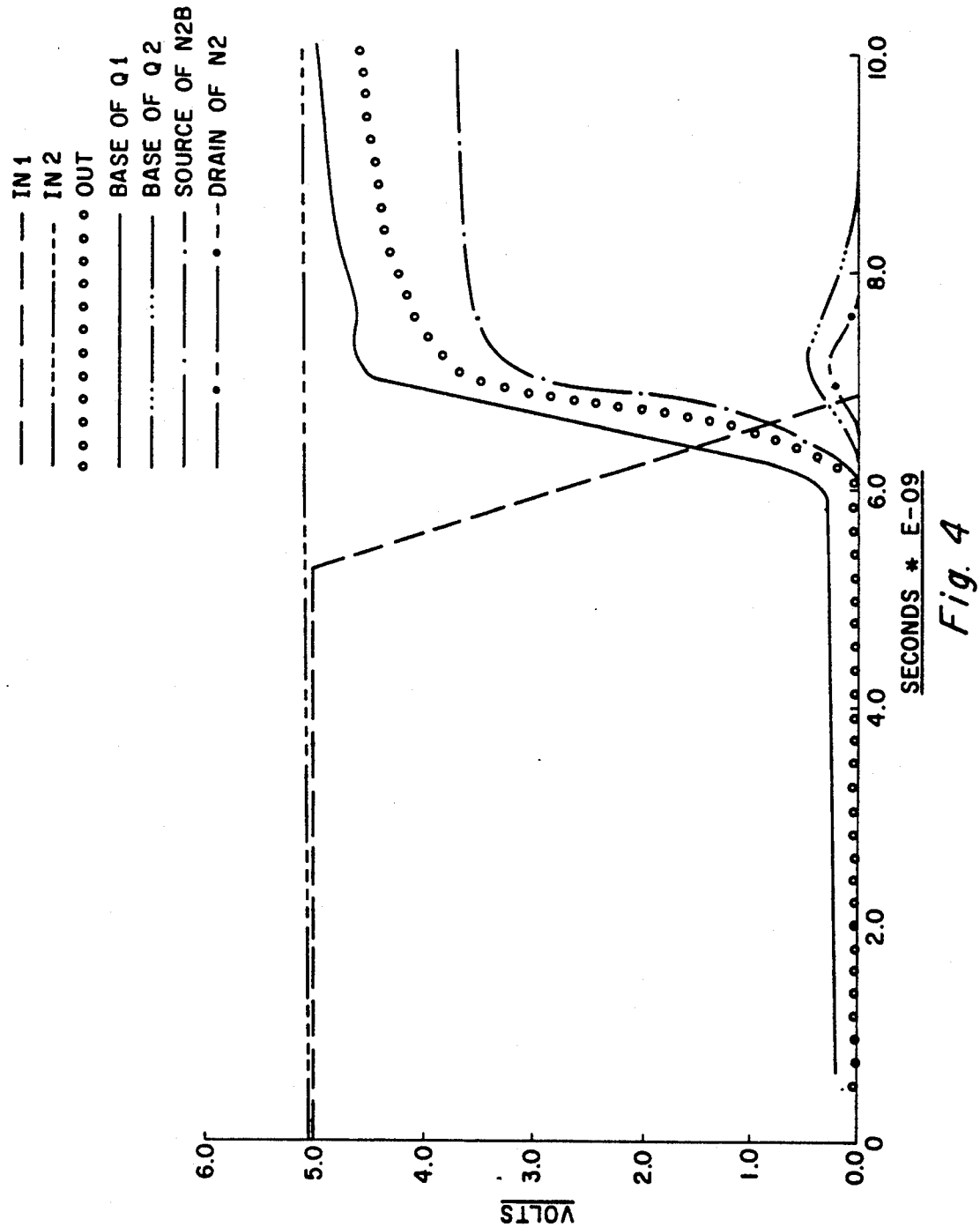

FIGS. 3 and 4 illustrate voltage vs. time plots for various inputs to a computer simulation of the circuit shown schematically in FIG. 1. Most of the through current (defined as the current from Vcc to circuit ground, which, as stated previously in all the drawings pertaining to the invention, is shown as voltage Vee, although voltages other than circuit ground may be used for Vee) between bipolar transistors Q1 and Q2 occur at the output falling edge. Through current is synonymous with leakage current. This Q1, Q2 through current is due to the relatively slow turn off of transistor Q1. The placement of transistor PB between the base and emitter of transistor Q1 helps drain transistor Q1's base charge through transistor Q2 and the paths through transistors N2B and N1B initially. Transistors N1 and N2 will continue to drain the remaining base charge when the output falls below the threshold voltage of transistor PB. The larger transistor PB is in size, the faster transistor Q1 will turn off. On the other hand, a larger transistor PB will decrease transistor Q1's base current and thus slow down output OUT's charging time. Transistor Q2, which is turned on during the output falling edge, plays an important role in draining transistor Q1's base charge through transistor PB. Transistor NB is intentionally made small in order to increase the base current to transistor Q2. Thus, the discharge path through transistors N2B, N1B and NB is not a very significant one. Transistors N1 and N2 need not be large since they discharge the remaining charge in the base of transistor Q1 and make sure Q1 is off. Minimum sizing for transistors N1 and N2 is sufficient. Transistor Q1's base voltage should be kept falling as fast as output OUT's voltage in order to prevent transistor Q1 from turning on during a falling edge of output OUT, as shown in FIG. 3. Transistor PB, in effect, keeps the base and emitter voltages of transistor Q1 close so that transistor Q1 will not be turned on during the time the output OUT being pulled down in voltage. In the output rising case, as shown in FIG. 4, the base of transistor Q1 and output OUT's voltages are initially very close to ground potential. Transistor PB will not turn on until the base of Q1 is charged up, thereby allowing more current to flow into the base of Q1 instead of flowing to output OUT. Once transistor PB is on, transistor Q1's emitter current will be weakened due to the reduced base current. The rate of the rising voltage at output OUT will be slowed. The point where the slowing down effect occurs can be adjusted by sizing transistor PB as discussed above. However, the size of transistor PB for different types of functions (e.g. NAND vs NOR) needs to be chosen correctly for optimal performance. In other words, the transistor P1 or transistor P2 to transistor PB ratio as well as bipolar sizing are important parameters to determine the overall performance of the logic circuit. Tradeoffs can be made between the transistor sizes of N1 or N2 and PB. The sizes of transistors N1 and N2 can be increased to drain the base charge of transistor Q1 better. Hence, through manipulation of the sizes of transistors N1 and N2, the size of transistor PB can be reduced. Note that the circuit in FIG. 1 is constructed in such a way that input IN1's signal arrives late. The voltage input IN2 should settle before the voltage at IN1 in order to give maximum performance for the circuit. Note that input IN1 is connected to the n-channel transistors which are closest to the bipolar bases. This configuration places input IN1 just one n-channel transistor away from discharging transistor Q1 or from providing base current to transistor Q2.

Figure 5:
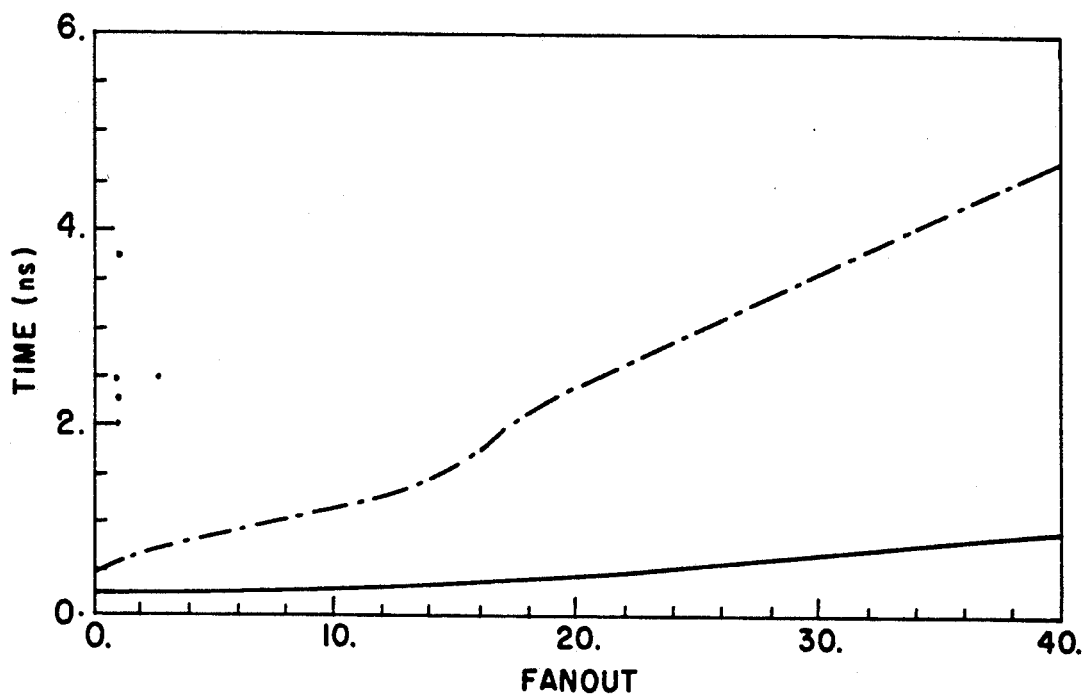
FIG. 5 illustrates a plot of rise/fall time vs. fanout for a computer simulation of the circuit of FIG. 1.

FIG. 5 illustrates a plot of rise/fall time vs. fanout for a computer simulation of the circuit of FIG. 1. The dashed line represents the rise time of the output vs. fanout of the circuit, whereas the solid line represents the fall time of the output vs. fanout of the circuit.

Figure 6A:
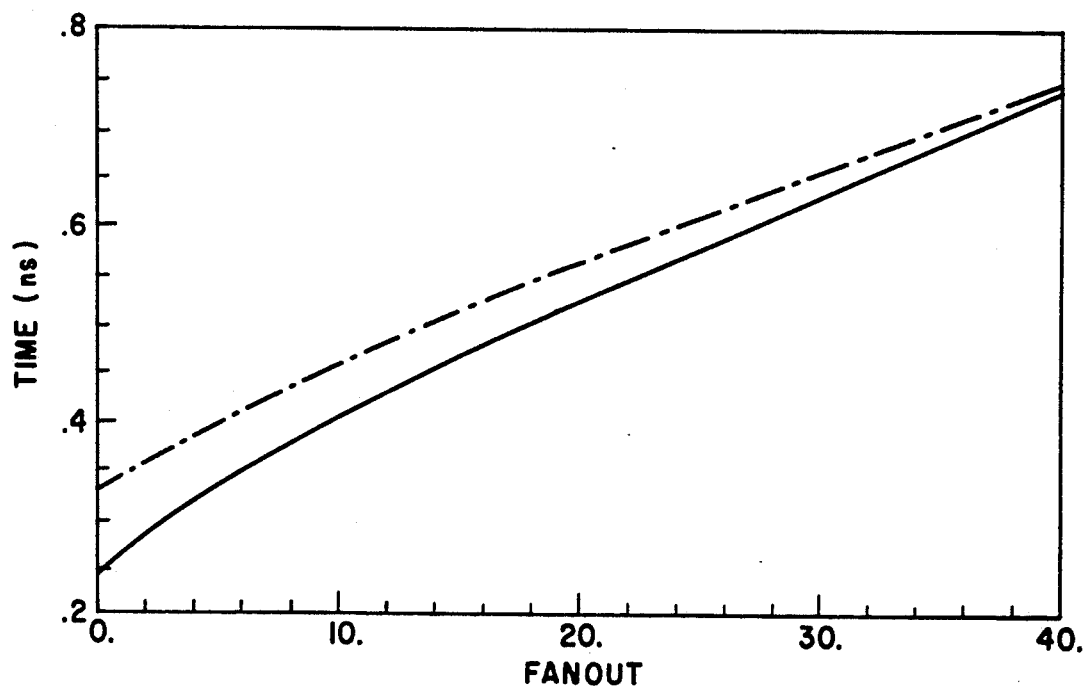
FIG. 6a illustrates a plot of delay vs. fanout for the computer simulation mentioned above with respect to FIG. 5.

FIG. 6a illustrates a plot of delay vs. fanout for the computer simulation mentioned above with respect to FIG. 5. The dashed line shows the rising delay time of the output vs. fanout for the circuit while the solid line shows the falling delay time of the output vs. fanout for the circuit.

FIG. 6b is a chart illustrating the effect of transistor sizing on circuit delay and through current. Note that it is desirable to eliminate or minimize through current since it results in wasted energy.

Figure 7:
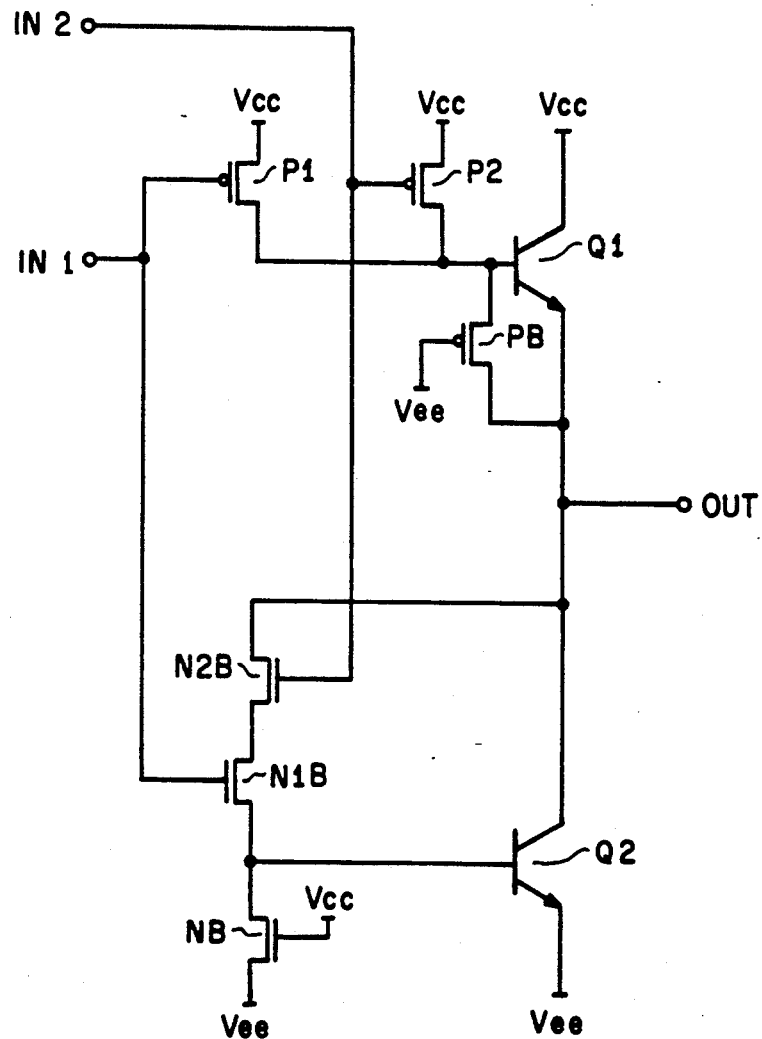
FIG. 7 is a schematic drawing which illustrates a second preferred embodiment of the invention.

FIG. 7 is a schematic drawing which illustrates a second preferred embodiment of the invention. This figure is the same as that shown in FIG. 1 with the exception that transistors N1 and N2 have been removed.

FIG. 8 illustrates the on and off states of the transistors in FIG. 7 in response to logical high or low inputs corresponding to 1 or 0 respectively at inputs IN1 and IN2. A plus sign being directly after "OFF" in FIG. 7 indicates that a transistor is off initially and will eventually turn on at steady state. A minus sign being directly after "ON" indicates that a transistor is initially on and will eventually turn off at steady state.

Figure 9:
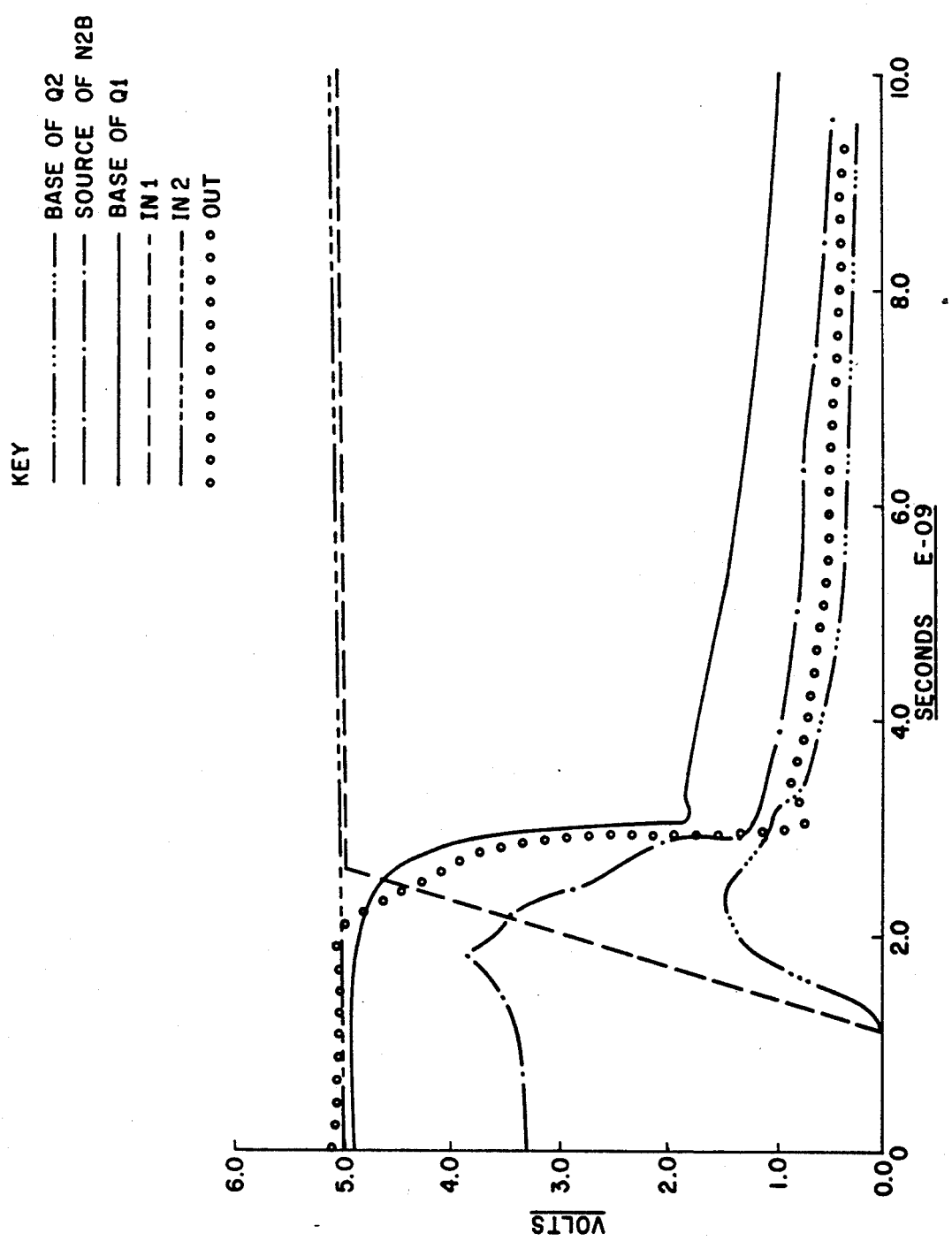
FIGS. 9 and 10 illustrate voltage vs. time plots for various inputs to a computer simulation of the circuit shown schematically in FIG. 7.
Figure 10:
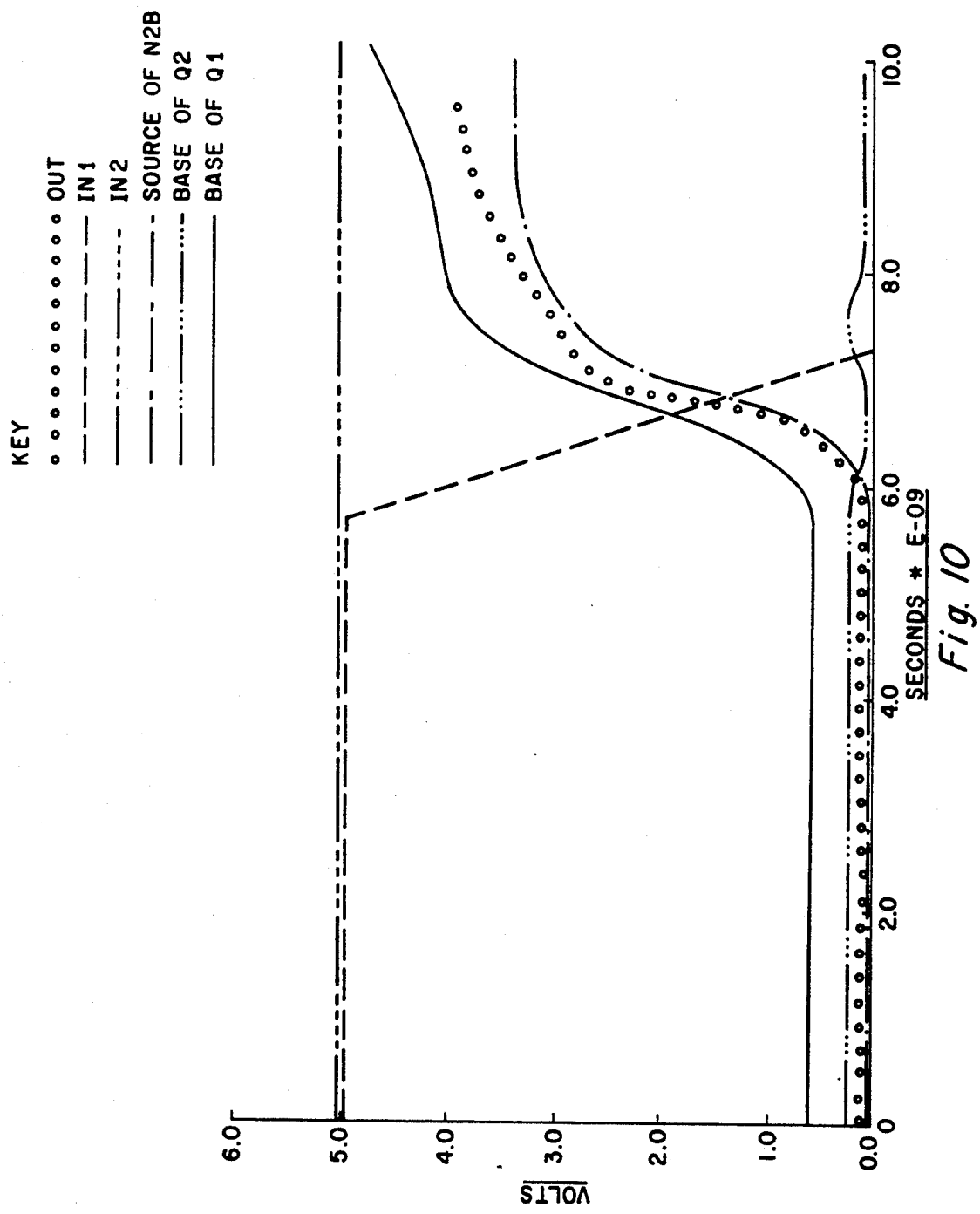

FIGS. 9 and 10 illustrate voltage vs. time plots for various inputs to a computer simulation of the circuit shown schematically in FIG. 7.

With reference to FIGS. 7, 8, 9 and 10, it can be seen that the operation of the second preferred embodiment of the invention is similar to the first preferred embodiment of the invention. However, the task of turning off transistor Q1 during the output OUT's falling edge is dependent generally on transistor PB alone. The effectiveness of transistor PB turning off transistor Q1 decreases as output OUT's voltage drops. This second embodiment of the invention is not as immune to noise as the first embodiment of the invention because there is no direct path from the base of transistor Q1 to circuit ground to hold transistor Q1 at an off state. However, note that this second embodiment of the invention economizes the logic circuit by not requiring at least two transistors in comparison with the first embodiment of the invention.

Figure 11:
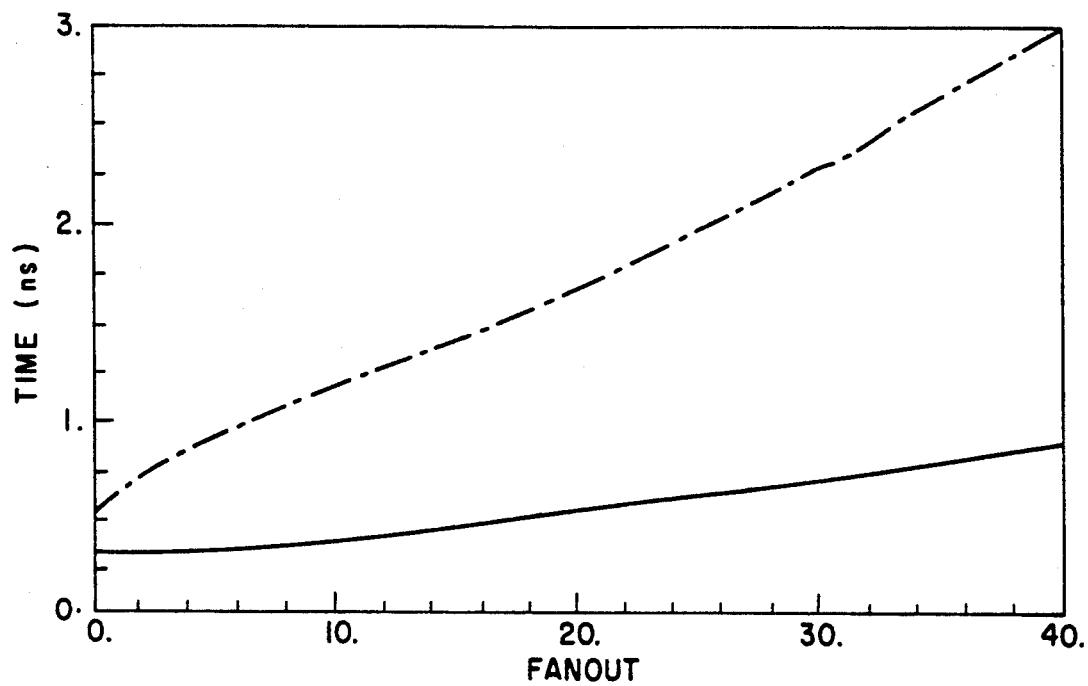
FIG. 11 illustrates a plot of rise/fall time vs fanout for a computer simulation of the logic circuit incorporating the second embodiment of the invention.

FIG. 11 illustrates a plot of rise/fall time vs. fanout for a computer simulation of the logic circuit incorporating the second embodiment of the invention. The dashed line represents the rise time of the output vs. fanout of the circuit, whereas the solid line represents the fall time of the output vs. fanout of the circuit.

Figure 12A:
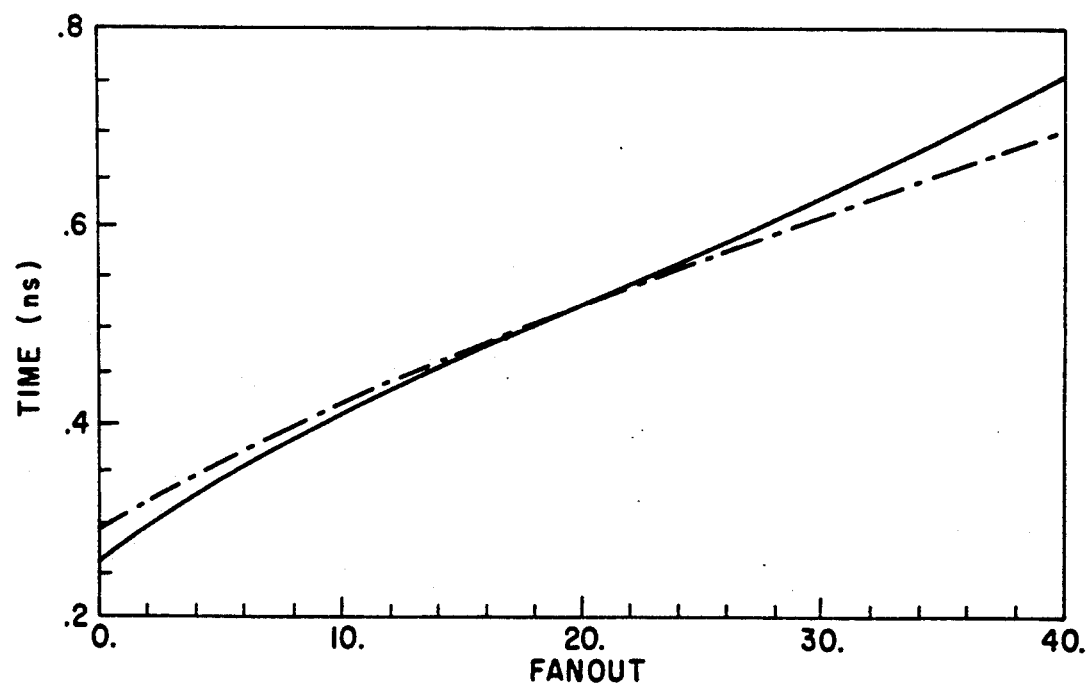
FIG. 12a illustrates a plot of delay vs. fanout for the computer simulation mentioned above with respect to FIG. 11.

FIG. 12a illustrates a plot of delay vs. fanout for the computer simulation mentioned above with respect to FIG. 11. The dashed line shows the rising delay time of the output vs. fanout for the circuit while the solid line shows the falling delay time of the output vs. fanout for the circuit.

FIG. 12b is a chart, pertaining to the second embodiment of the invention, which illustrates the effect of transistor sizing on delay and through current.

Figure 13:
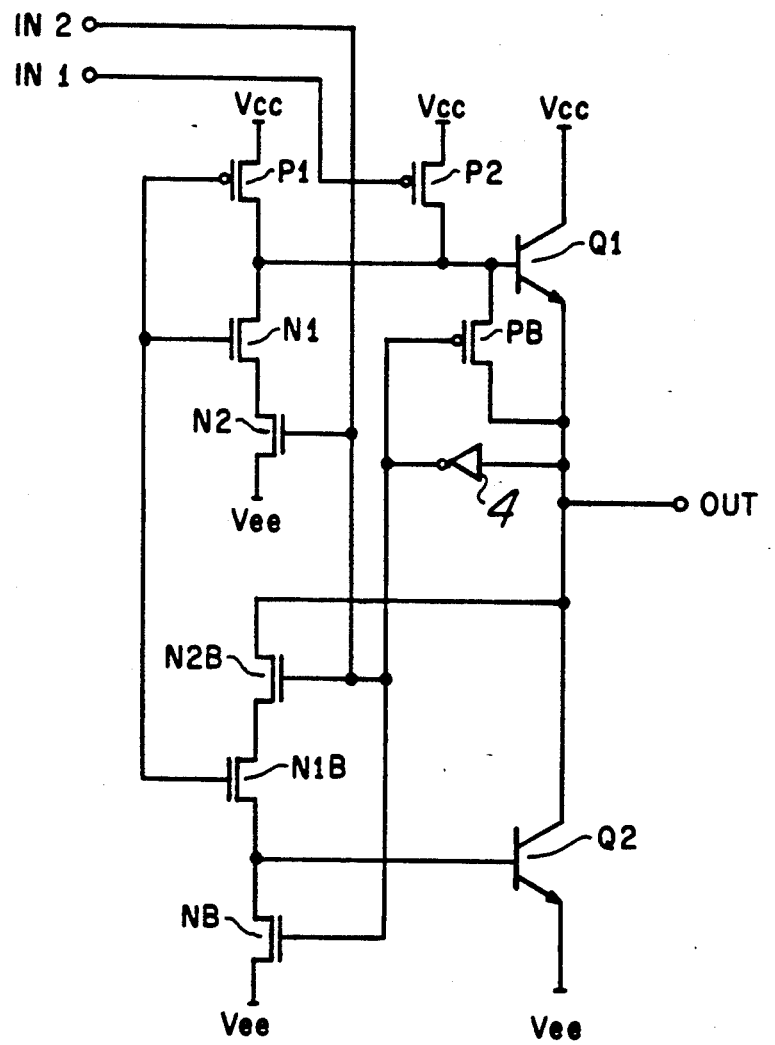
FIG. 13 illustrates a schematic drawing of a third preferred embodiment of the invention.

FIG. 13 illustrates a schematic drawing of a third embodiment of the invention. This embodiment of the invention is the same as the first embodiment of the invention with the exception that inverter 4 has been added and the gates of transistors NB and PB are no longer hardwired to power rails. Inverter 4 is connected to and between the gate and drain of transistor PB. The gates of transistor NB and PB are connected together.

FIG. 14 illustrates the on and off states of the transistors in FIG. 13 in response to logical high or low inputs corresponding to 1 or 0 respectively at inputs IN1 and IN2. A plus sign being directly after "OFF" in FIG. 2 indicates that a transistor is off initially and will eventually turn on at steady state. A minus sign being directly after "ON" indicates that a transistor is initially on and will eventually turn off at steady state. HL after the inverter output represents a transition from high to low on the inverter output while LH after the inverter output represents a transition from low to high on the inverter output.

Figure 15:
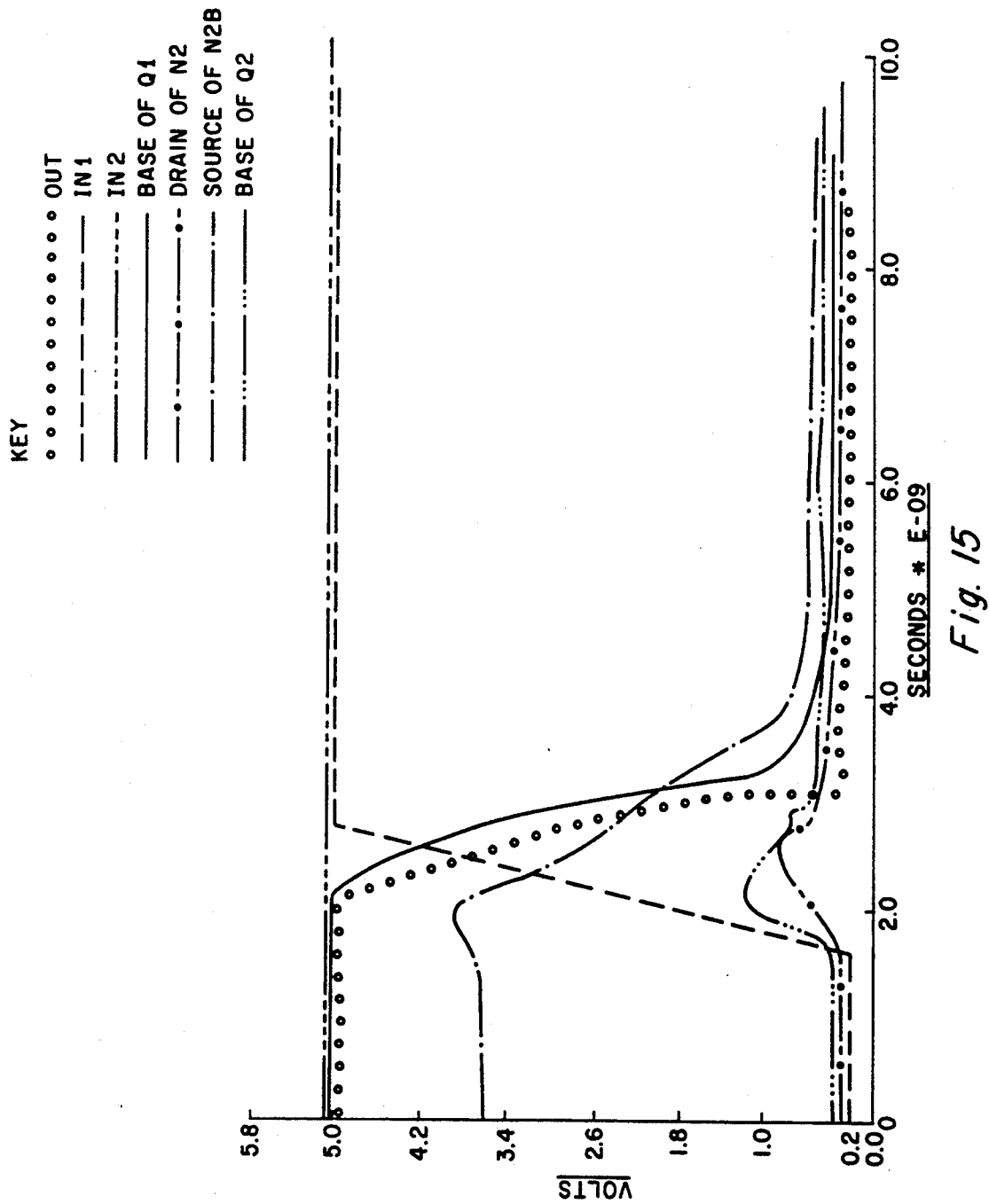
FIGS. 15 and 16 illustrate voltage vs. time plots for various inputs to a computer simulation of the circuit shown schematically in FIG. 7.
Figure 16:
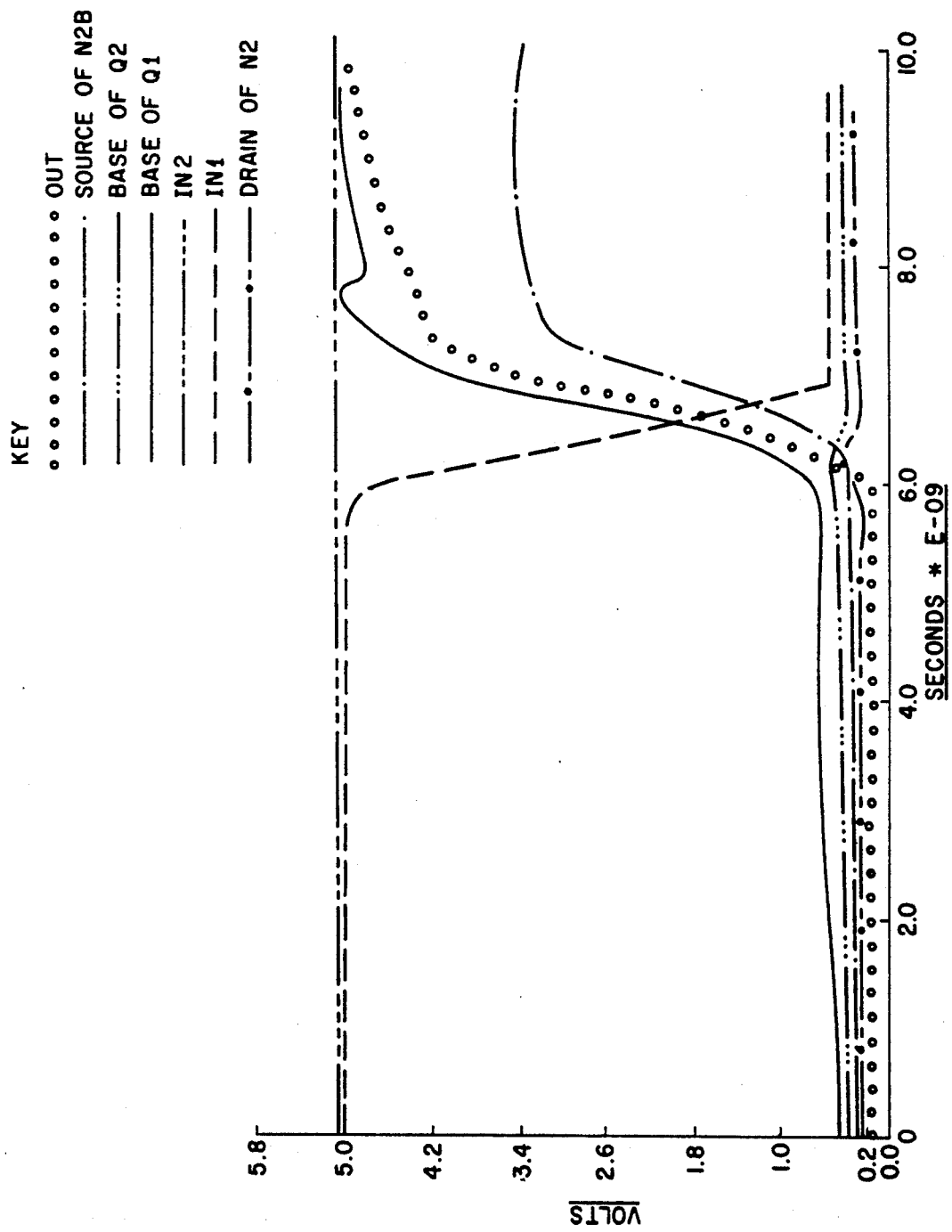

FIGS. 15 and 16 illustrate voltage vs. time plots for various inputs to a computer simulation of the circuit shown schematically in FIG. 13.

With reference to FIGS. 13, 14, 15 and 16, it can be seen that the operation of this third preferred embodiment of the invention is similar to the first embodiment of the invention. However, operation of transistors PB and NB are now controlled by inverter 4. Inverter 4 can be small in size and is controlled by output OUT. Inverter 4 will not turn transistor PB on until output OUT gets above inverter 4's input threshold voltage. This allows more base current flow into transistor Q1 during output OUT's rising edge. Turning transistor PB on later also moves the knee of the output rising edge in comparison with the second embodiment (see FIG. 16 and compare with FIG. 10) to a higher voltage because transistor Q1 has been turned on longer in order to charge up output OUT. Similarly, inverter 4 keeps transistor NB off initially while pulling down output OUT in voltage. This translates into more base current to the base of transistor Q2. Eventually, output OUT drops in voltage below the inverter input threshold voltage. Transistor NB is then turned on and pulls output OUT all the way to circuit ground. Thus rail-to-rail output switching is provided with minimized base current loss due to the level restoring characteristics of transistors PB and NB.

Figure 17:
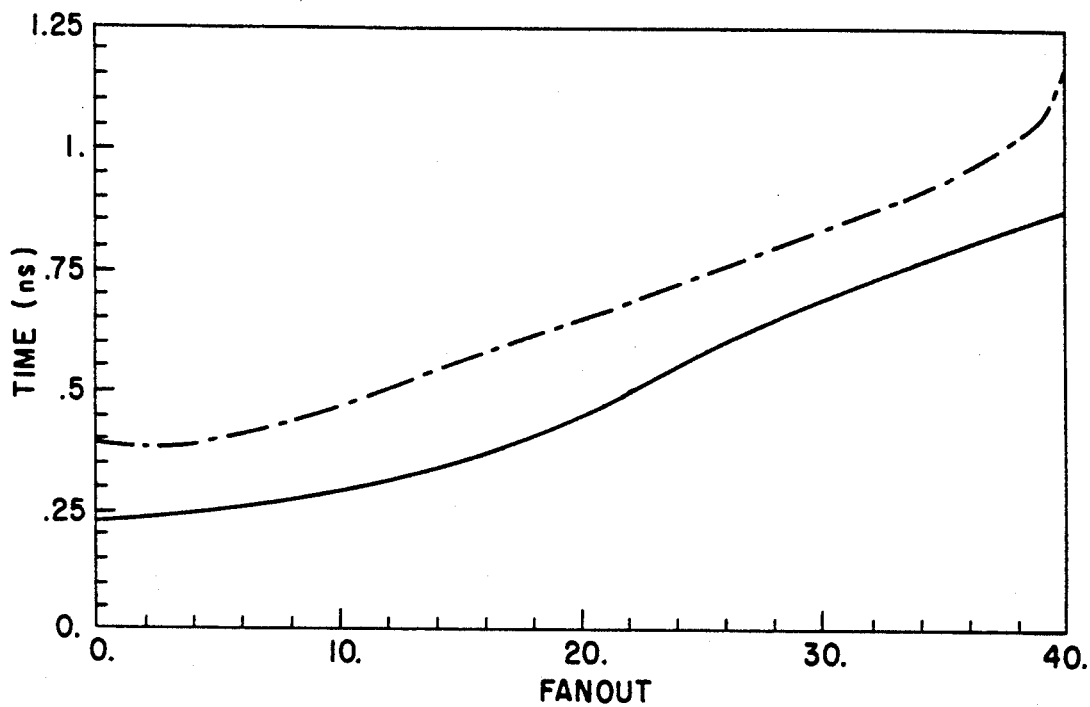
FIG. 17 illustrates a plot of rise/fall time vs. fanout for a computer simulation of the logic circuit incorporating the third embodiment of the invention.

FIG. 17 illustrates a plot of rise/fall time vs. fanout for a computer simulation of the logic circuit incorporating the third embodiment of the invention. The dashed line represents the rise time of the output vs. fanout of the circuit, whereas the solid line represents the fall time of the output vs. fanout of the circuit.

Figure 18A:
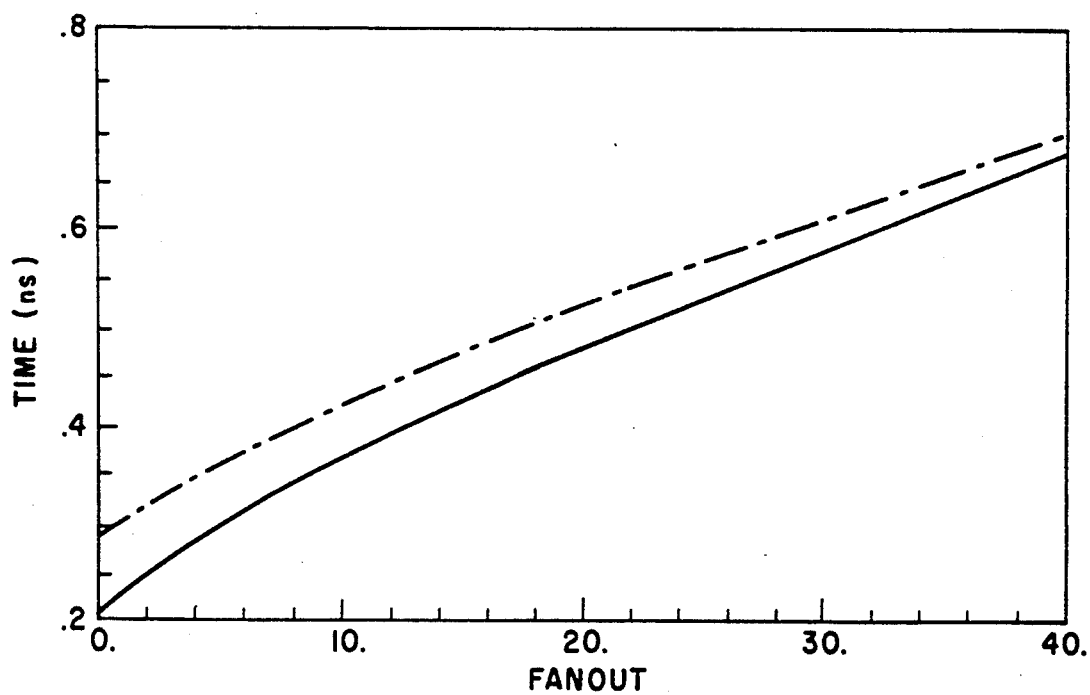
FIG. 18a illustrates a plot of delay vs. fanout for the computer simulation mentioned above with respect to FIG. 17.

FIG. 18a illustrates a plot of delay vs. fanout of the computer simulation mentioned above with respect to FIG. 17. The dashed line shows the rising delay time of the output vs. fanout for the circuit while the solid line shows the falling delay time of the output vs. fanout for the circuit.

FIG. 18b illustrates a chart of transistor sizing and its effect upon circuit delay and through current. WIP and WIN represent the sizes of p-channel and n-channel transistors respectively within inverter 4 of FIG. 13.

Figure 19:
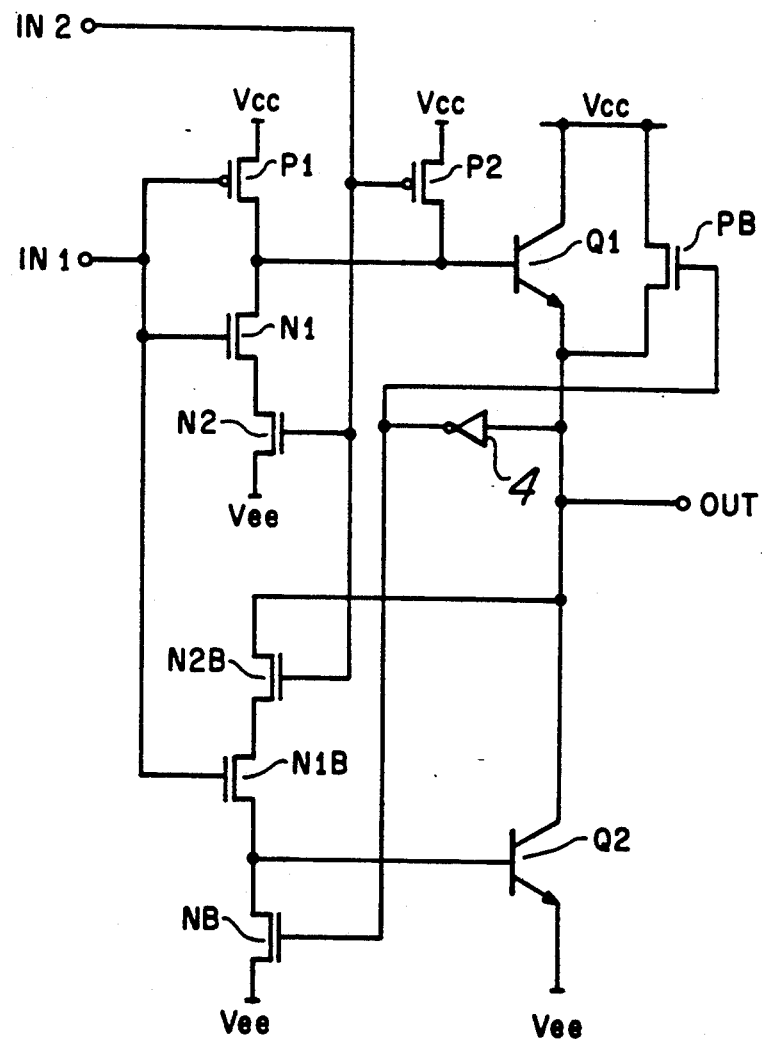
FIG. 19 illustrates a schematic drawing of a fourth preferred embodiment of the invention.

FIG. 19 illustrates a schematic drawing of a fourth preferred embodiment of the invention. This embodiment of the invention is the same as the third embodiment of the invention with the exception that the source and drain of transistor PB is connected to and between Vcc and output OUT. This embodiment of the invention may be faster than the third embodiment of the invention depending upon the resistances of transistors P2 plus PB. Additionally, notice that there is now no base current drain away from transistor Q1 through transistor PB while charging output OUT through Q1. Unlike that shown in FIG. 16 with respect to the third embodiment of the invention, the knee of the output rising waveform occurs at approximately Vcc-Vbe since there is no substantial circuit slowing down by transistor PB. On the other hand, transistors N1 and N2 need to be sized carefully to turn transistor Q1 off while discharging output OUT to prevent excessive crowbar current.

Figure 20:
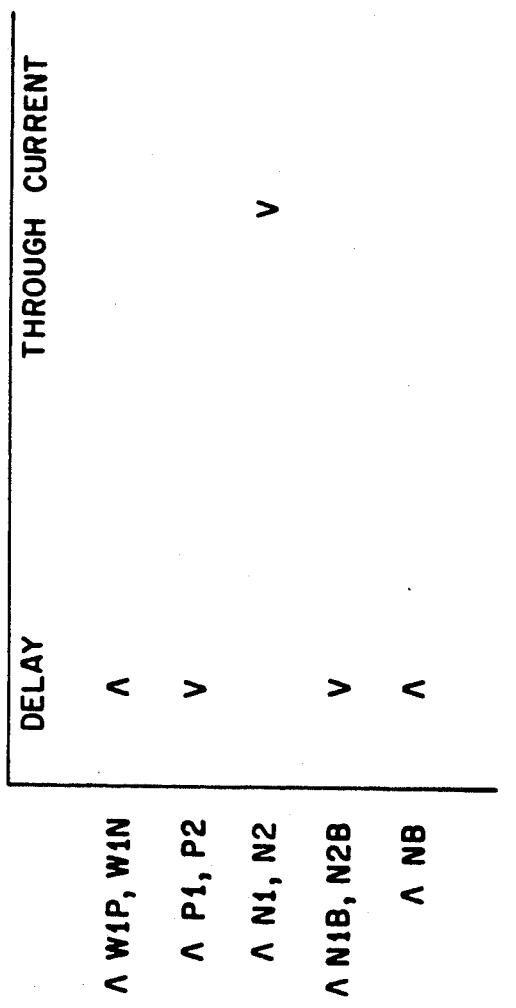
FIG. 20 is a chart which illustrates transistor sizing effects upon circuit delay and through current.

FIG. 20 is a chart which illustrates transistor sizing effects upon circuit delay and through current.

Figure 21:
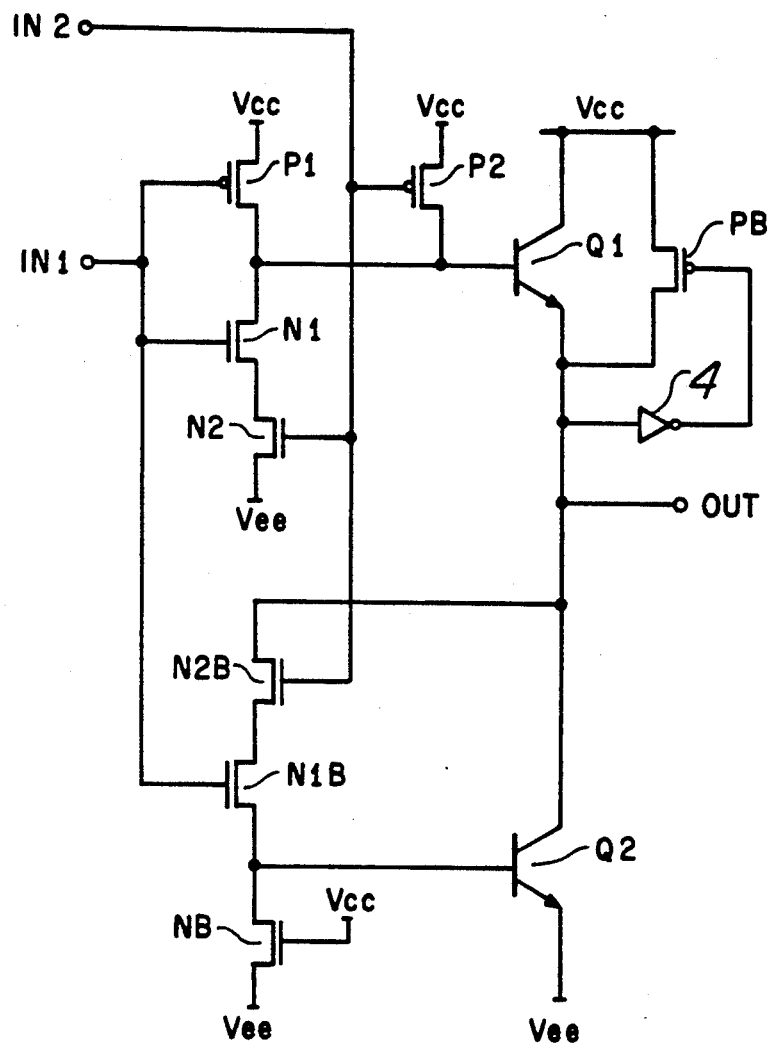
FIGS. 21 and 22 are schematic drawings of fifth and sixth preferred embodiments, respectively, of the invention.
Figure 22:
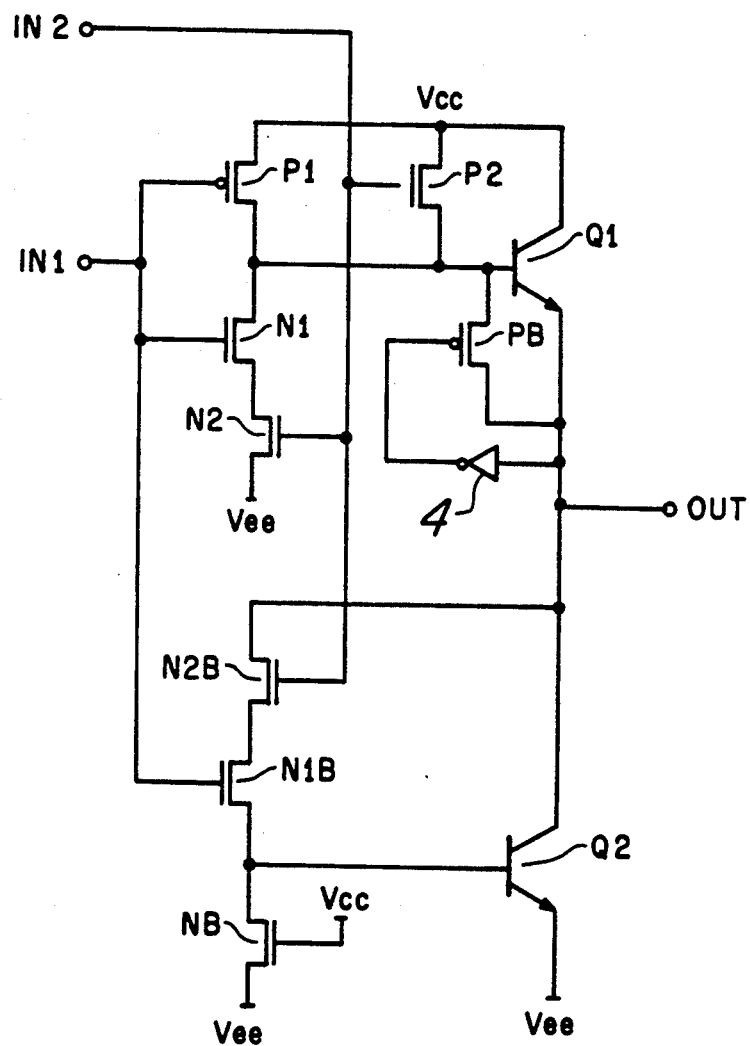

FIGS. 21 and 22 are schematic drawings which illustrate fifth and sixth preferred embodiments, respectively, of the invention. FIG. 21 is the same as FIG. 19 with the exception that the gate of transistor NB is tied to voltage Vcc. FIG. 22 is the same as FIG. 13 with the exception that the gate of transistor NB is likewise tied to voltage Vcc. Thus, for both of these embodiments transistor NB will be turned on all of the time. A DC (direct current) path between the base of transistor Q2 and Vee (Vee before was indicated as having a value of circuit ground, although other voltages are possible) is established. These embodiments do not let the base of transistor Q2 float. Furthermore, these embodiments keep the base of transistor Q2 very close to circuit ground rather than Vbe. Therefore the chance of transistor Q2 misfiring when coupling from other activities in the circuit to transistor Q2's base is reduced.

Although the invention has been described in detail, it is to be understood that this description is by way of example only, and is not to be construed in a limiting sense. It is to be further understood that numerous changes in the details of the embodiments of the invention, and additional embodiments of the invention, will be apparent to and may be made by persons of ordinary skill in the art having reference to this description. For instance, NPN bipolar transistors may be substituted for PNP bipolar transistors. Furthermore, p-channel transistors may be substituted for n-channel transistors and vice-versa. Additionally note that NAND gate logic circuits have been shown in the drawings simply because all logic expressions can be implemented strictly with NAND or NOR gates. Those circuits shown can be easily adapted to perform NOR, OR, and AND logic functions. It is contemplated that all such changes, additions, and adaptations are well within the spirit and true scope of the invention as claimed below. Accordingly, the invention is intended to be limited only by the scope of the appended claims.

We claim:

1. A circuit comprising:
   a first pull-up device including at least two terminals, connected to the output of said circuit, said first pull-up device being operable to bring said circuit output to a first predetermined voltage value;
   a first field effect transistor connected to and between selected terminals of said first pull-up device, said first field effect transistor being operable to bring said circuit output to a second predetermined voltage value in connection with the output reaching said first predetermined voltage value;
   an inverter connected at its input to said circuit output, said inverter being further connected to the gate of said first field effect transistor; and
   a first pull-down device connected to said circuit output;
   a second field effect transistor coupled to said circuit output, said first pull-down device and said second field effect transistor being operable to bring said circuit output to third and fourth predetermined voltage values respectively.

2. A circuit comprising:
   a first pull-up transistor connected to the output of said circuit, said first pull-up transistor being operable to bring said circuit output to a first predetermined voltage value;
   a first field effect transistor connected to and between the emitter and collector of said first pull-up bipolar transistor, said first field effect transistor being operable to bring said circuit output to a second predetermined voltage value in connection with the output reaching said first predetermined voltage value;
   a first pull-down device connected to said circuit output;
   a second field effect transistor coupled to said circuit output, said first pull-down device and said second field effect transistor being operable to bring said circuit output to third and fourth predetermined voltage values respectively; and
   an inverter connected at its input to said circuit output, said inverter being further connected to the gates of said first and second field effect transistors.

* * * * *